United States Patent
Lin et al.

(10) Patent No.: US 10,755,953 B2
(45) Date of Patent: *Aug. 25, 2020

(54) CLUSTER TOOL TECHNIQUES WITH IMPROVED EFFICIENCY

(71) Applicant: Taiwan Semiconductor Manufacturing Co., Ltd., Hsin-Chu (TW)

(72) Inventors: Su-Horng Lin, Hsinchu (TW);
Tsung-Hsun Yu, Hsin Chu (TW);
Victor Y. Lu, Foster City, CA (US)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/656,804

(22) Filed: Oct. 18, 2019

(65) Prior Publication Data
US 2020/0051837 A1 Feb. 13, 2020

Related U.S. Application Data

(63) Continuation of application No. 14/798,938, filed on Jul. 14, 2015, now Pat. No. 10,510,566.

(51) Int. Cl.
*H01L 21/67* (2006.01)
*H01L 21/677* (2006.01)
*C30B 25/02* (2006.01)

(52) U.S. Cl.
CPC .. *H01L 21/67207* (2013.01); *H01L 21/67167* (2013.01); *H01L 21/67184* (2013.01);
(Continued)

(58) Field of Classification Search
CPC ......... H01L 21/67184; H01L 21/67745; H01L 21/671678; C30B 25/02
See application file for complete search history.

(56) References Cited

U.S. PATENT DOCUMENTS 6,122,566 A 9/2000 Nguyen et al.
6,328,858 B1 12/2001 Felsenthal et al.
(Continued)

OTHER PUBLICATIONS

Notice of Allowance dated Sep. 18, 2019 in connection with U.S. Appl. No. 14/798,938.
(Continued)

*Primary Examiner* — Matthew J Song
(74) *Attorney, Agent, or Firm* — Eschweiler & Potashnik, LLC

(57) ABSTRACT

The present disclosure relates to some embodiments of a method for improving processing efficiency of a cluster tool. The method comprises transferring a first lot of wafers from a transfer load lock to a designated storage load lock and transferring a second lot of wafers from the transfer load lock to the designated storage load lock while the first lot of wafers is in the transfer load lock or the designated storage load lock. The designated storage load lock has the same structure as the transfer load lock and respectively has an inner load lock portal at an interface with the first transfer chamber and an outer load lock portal on a sidewall of a front end interface. The inner load lock portal of the designated storage load lock is retained opened during processing. The outer load lock portal of the designated storage load lock is retained closed during processing.

20 Claims, 14 Drawing Sheets

(52) U.S. Cl.
CPC .. *H01L 21/67201* (2013.01); *H01L 21/67745* (2013.01); *H01L 21/67769* (2013.01); *C30B 25/02* (2013.01)

(56) References Cited

U.S. PATENT DOCUMENTS

| | | |
|---|---|---|
| 10,510,566 B2 * | 12/2019 | Lin .................. H01L 21/67745 |
| 2007/0020890 A1 | 1/2007 | Thakur et al. |
| 2008/0019809 A1 | 1/2008 | Takano |
| 2008/0245767 A1 | 10/2008 | Kim et al. |
| 2009/0020802 A1 | 1/2009 | Ma et al. |
| 2014/0271054 A1 | 9/2014 | Weaver et al. |
| 2015/0371883 A1 | 12/2015 | Takahashi et al. |

OTHER PUBLICATIONS

Final Office Action dated Apr. 26, 2019 in connection with U.S. Appl. No. 14/798,938.
Non-Final Office Action dated Dec. 17, 2018 in connection with U.S. Appl. No. 14/798,938.
Final Office Action dated May 17, 2018 in connection with U.S. Appl. No. 14/798,938.
Non-Final Office Action dated Oct. 5, 2017 in connection with U.S. Appl. No. 14/798,938.

* cited by examiner

CLUSTER TOOL TECHNIQUES WITH IMPROVED EFFICIENCY

REFERENCE TO RELATED APPLICATION

This Application is a Continuation of U.S. application Ser. No. 14/798,938, filed on Jul. 14, 2015 (now U.S. Pat. No. 10,510,566, issued on Dec. 17, 2019), the contents of which are hereby incorporated by reference in their entirety.

BACKGROUND

Cluster tools are used in many aspects of semiconductor processing. Cluster tools have multiple processing chambers which are integrated in a closed environment and which are configured to separately process semiconductor wafers. Wafers to be processed are transferred in, out, and between the processing chambers by robot arms, which are also integrated in the cluster tool. Cluster tools are advantageous in that they can streamline processing because multiple wafers can be processed within a single tool, and can reduce contamination because wafers are protected from the ambient environment when transferred between processing chambers within the cluster tool.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
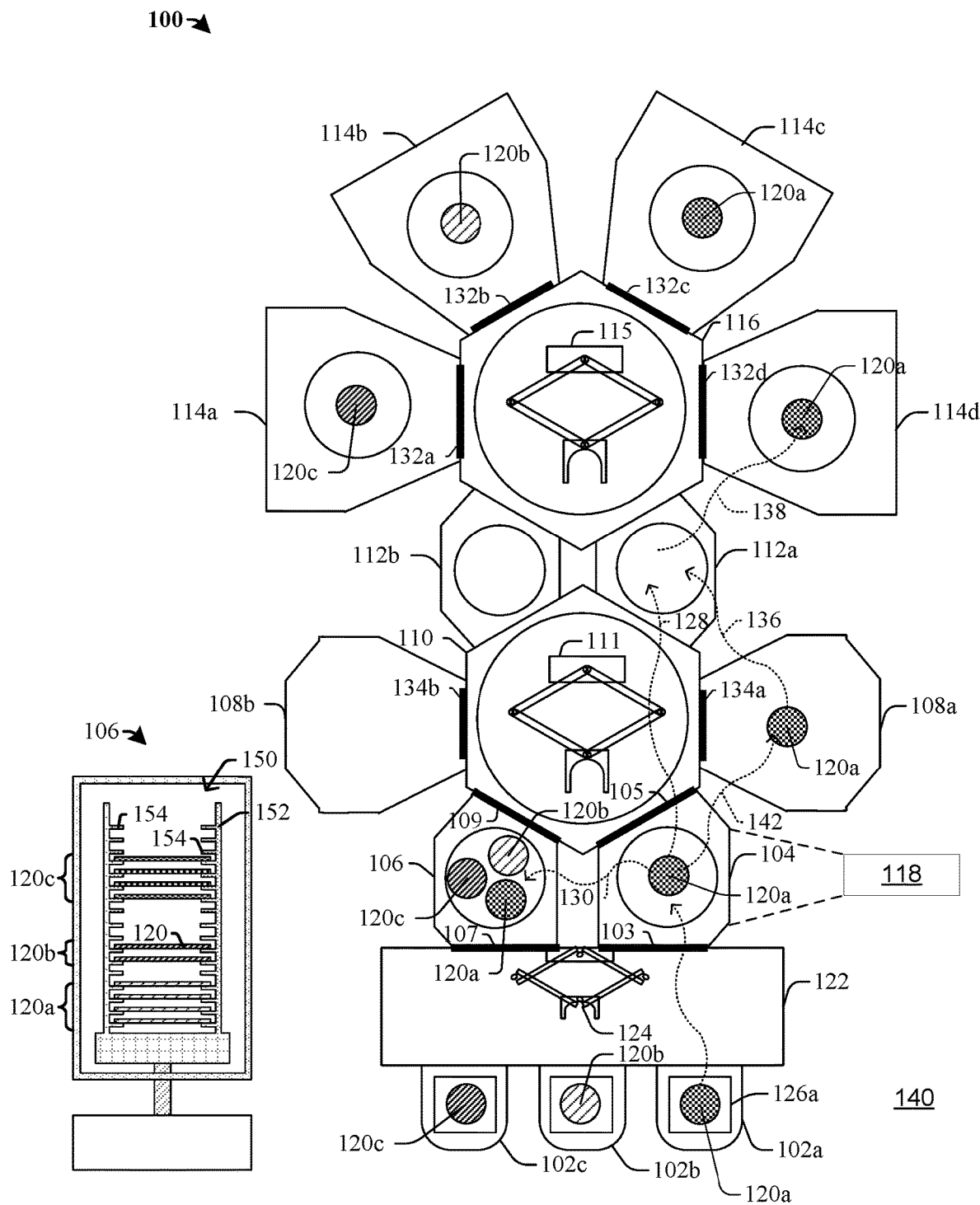
FIG. 1 shows a schematic view of some embodiments of a cluster tool.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (ICs) are manufactured by building up successive patterned layers, such as semiconductor layers, dielectric layers, and metal layers, on a semiconductor wafer. In an IC fabrication facility (fab), wafers are grouped into lots or batches, which are moved through various tools to form and pattern the various layers on the wafers. Each lot or batch of wafers can be stored in a wafer carrier, such as a front opening universal pod (FOUP) or standard mechanical interface (SMIF). The wafer carrier is then used to carry the wafers of a batch or lot between various processing tools, often via a conveyor belt or overhead transfer assembly and/or via lifters, hoists, etc., such that the processing tools can carry out suitable processing steps to form the desired patterned layers to build-up the ICs on the wafers.

One particular type of tool that can process the wafers is a cluster tool, such as used for epitaxial deposition for example. When a wafer carrier arrives at a cluster tool, the wafer carrier is placed on a loading port of the cluster tool. While sitting on the loading port, the wafer carrier is opened and the wafers inside the wafer carrier can be exposed to the ambient environment of the fab. A front end transfer robot then removes the wafers from the opened wafer carrier and places the wafers into a load lock, which is a relatively small chamber on a front side of the cluster tool. After the wafers have been loaded into the load lock, the load lock is closed to be isolated from the ambient environment (which is typically at atmospheric pressure) and from other chambers in the cluster tool (which are typically at vacuum). The load lock is then pumped down to vacuum. An inner portal of the load lock is then opened, and the wafers are then transferred from the load lock, through the inner portal, and into processing chambers within the cluster tool. Processing chambers can then carry out processing, such as epitaxial deposition, on the wafers. After the processing is completed, the wafers are transferred from the processing chambers back to the load lock, from which the wafers can be placed back into the wafer carrier and moved onto the next process tool. Suffice it to say, the amount of processing time the wafers experience in the processing chambers is significant compared to the amount of time needed to transfer the wafers in and out of the cluster tool. Therefore, to improve overall throughput of the cluster tool, it is important to limit the amount of time during which the process chambers are vacant or idle.

Accordingly, the present disclosure relates to improved techniques of processing wafers in cluster tools. In some embodiments, a cluster tool includes a designated storage area within an inner chamber of the cluster tool behind its load lock. One or more lots of wafers can be temporarily stored within this designated storage area, which acts as an intermediate landing point between processing chambers or between a load lock and a processing chamber, for example. Compared to prior art approaches where wafers were only moved directly between a load lock and processing chambers, this designated storage area allows for greater flexibility in how wafers can be moved within the cluster tool to limit the amount of time when processing chambers are idle or vacant. Thus, the designated storage area helps to improve efficiency of the cluster tool, thereby helping to improve the overall throughput of the fab.

FIG. 1 shows a schematic view of a cluster tool 100 in accordance with some embodiments. The cluster tool 100 comprises a first transfer chamber 110 and a second transfer chamber 116, which are connected through a pair of via connector chambers 112a, 112b. A number of processing chambers 114a, 114b, 114c, 114d are arranged about the first transfer chamber 110, and a number of pre-clean chambers 108a, 108b are arranged about the second transfer chamber 116. The processing chambers 114a-114d may have portals or seals 132a-132d, respectively, which allow the respective processing chambers to perform independent processing steps; and the pre-clean chambers 108a, 108b may also have portals or seals 134a, 134b, respectively, which allow the pre-clean chambers 108a, 108b to perform independent cleaning steps. A transfer load lock 104 and a designated storage chamber 106 are also present.

As will be appreciated in more detail below, the designated storage chamber 106 helps to streamline processing by providing a temporary landing/storage area for wafers which have already been processed or which are still awaiting processing, while leaving the inner chambers of the cluster tool under vacuum. This allows for more flexible processing and more flexible ordering of wafers within the cluster tool while limiting exposure of inner chambers 106, 108, 110, 112, 114, 116 to the ambient fab environment by limiting the number of times the transfer load lock 104 is opened/closed.

During operation of the cluster tool 100, a control unit 118 is configured to control transfer robots 111, 115, and 124; portals 103, 105, 132, 134; and vacuum pumps for the various chambers according to the following sequence. The control unit 118 can include a memory and a microprocessor, as well as servos, actuators, and the like to facilitate the operation described below. Further, inner chambers 106, 108, 110, 112, 114, and 116 of cluster tool 100 are typically retained under continuous vacuum during the operation described below.

At the onset of operation, a wafer carrier 126a is placed on a first loading port 102a of the cluster tool 100, and an outer load lock portal 103 is opened while an inner load lock portal 105 remains closed to retain vacuum for the inner chambers of cluster tool 100. The wafer carrier 126a is opened (i.e., wafers are exposed to ambient fab environment 140), and front end transfer robot 124, which is disposed within a housing of a front end interface 122, then removes the wafers 120a from the opened wafer carrier 126a. The front end transfer robot 124 moves the wafers 120a through outer load lock portal 103 and into transfer load lock 104. After the wafers 120a have been loaded into the transfer load lock 104, the outer load lock portal 103 is closed. The transfer load lock 104 is then pumped down to vacuum. The inner load lock portal 105 is then opened, and the wafers 120a are then picked up by the first transfer robot 111. The first transfer robot 111 can move the wafers to the pre-clean chambers 108 (line 142), via connector chambers 112 (line 128), and/or designated storage chamber 106 (line 130).

Typically, the first transfer robot 111 initially moves the wafers to a pre-clean chamber 108a (see line 142), where a pre-cleaning routine such as a rinse with deionized water, acetone, surfactant, or other cleaning process is used to clean the surface of the wafers 120. The cleaning routine can also include a photoresist strip process, such as a plasma stripping process, for example.

The first transfer robot 111 can then typically move the wafers 120a to the via connection chamber 112a (line 136). The second transfer robot 115 can then pick-up the wafers 120a from the via connection chamber 112a, and after opening a chamber portal (e.g., 132d), can place the pre-cleaned wafers into a processing chamber, e.g., 114d, for processing (line 138). After the wafers are placed in the processing chamber 114d, the chamber portal 132d can be closed, and the processing, such as an epitaxial growth process, can be performed to grow an epitaxial layer on the wafers 120a. After processing, the chamber portal 132d is re-opened, and the second transfer robot 115 can place the processed wafers back in the via connection chamber 112a.

Notably, depending on the state of processing in the processing chambers 114 and other wafers waiting to be processed, the first transfer robot 111 may place the processed wafers 120a into the designated storage chamber 106 until an opportune time arrives to route the wafers back out of the transfer load lock 104. Alternatively, the wafers 120a may be placed into the designated storage chamber 106 before being processed, for example, until a processing chamber is available. The designated storage chamber 106 may include a wafer rack 150 that includes a plurality of slots or recesses configured to hold individual wafers 120. For example, in FIG. 1, the wafer rack 150 is illustrated as having vertical sidewalls 152 and horizontal protrusions 154 extending outwardly from the vertical sidewalls 152. Vertical spaces between neighboring protrusions are greater than the thickness of a wafer, such that individual wafers 120 can be stacked in the slots or recesses, respectively, one over another. In FIG. 1's example, wafers from three lots 120a, 120b, 120c are stored in the designated storage chamber 106 concurrently. Often, all wafers of a same lot are moved into the cluster tool together through a single use of transfer load lock 104.

The wafer rack 150 has a sufficient number of slots to hold wafers of multiple lots concurrently. In some embodiments, fewer wafers can be grouped in each lot in order to improve queue time comparing previous standard twenty-five wafers lots. In some embodiments, there is one to one, or two to one, correspondence between number of wafers in a lot corresponds to number of processing chambers 114. For example, for a processing tool having four processing chambers, four or eight wafers can be grouped in one lot and there are partial or dedicate lots in which only one or two wafers are placed. For example, the wafer rack 150 can hold twenty-eight or more wafers. This provides sufficient storage to allow wafers to be flexibly processed within the cluster tool 100 in a pipelined fashion while the transfer load lock 104 can be opened to insert/remove lots of wafers respectively. This helps to improve throughput, and also reduces potential contamination which can enter inner chambers of the cluster tool from the ambient fab environment 140 through the transfer load lock 104.

In some embodiments, the designated storage chamber 106 has the same structure as the transfer load lock 104. For example, the designated storage chamber 106 may have an outer load lock portal 107 at an interface with the first transfer chamber 110, similar to the outer load lock portal 103 of the transfer load lock 104. The designated storage chamber 106 may also have an inner load lock portal 109 at an interface with the front end interface 122, similar to the inner load lock portal 105 of the transfer load lock 104. Whereas, in some embodiments, wafers may be moved solely between the designated storage chamber 106 and the first transfer chamber 110 by the first transfer robot 111, wafers are not be moved between the designated storage chamber 106 and the front end interface 122. The outer load lock portal 107 of the designated storage chamber 106 may be retained fixedly closed during processing without allowing wafers to be transferred from designated storage chamber 106 to ports 102a-102c by front end robot 124. The inner load lock portal 109 of the designated storage chamber 106 may be retained fixedly opened during processing, since the vacuum environment of the designated storage chamber 106 would not be broken without using load lock transfer function to and from the front end interface 122.

As described in detail below, similar processes as above can be repeated to load and unload all lots of wafers for processing. In some embodiments, multiple lots of wafers can be transferred from the transfer load lock 104 and stored in the designated storage chamber 106 simultaneously. An outer load lock portal 107 at an interface of the designated storage chamber 106 and the front end interface 122 is kept closed during the processing of those multiple lots of wafers. The maximum lots that can be stored may depend on amount of load ports 102 available. Depending on amount of wafers and sequence of the lots, in some embodiments, wafers of different lots can be transferred to the epitaxial deposition chambers 114 in succession in one batch as long as there are epitaxial deposition chambers available; and/or wafers of the same lot may need to be divided to across multiple different epitaxial deposition chambers for processing. If wafers of multiple lots are finished successively, these lots of wafers can be sent out from the transfer load lock 104 together (i.e., during a single opening and closing of the transfer load lock 104).

Figure 2A:
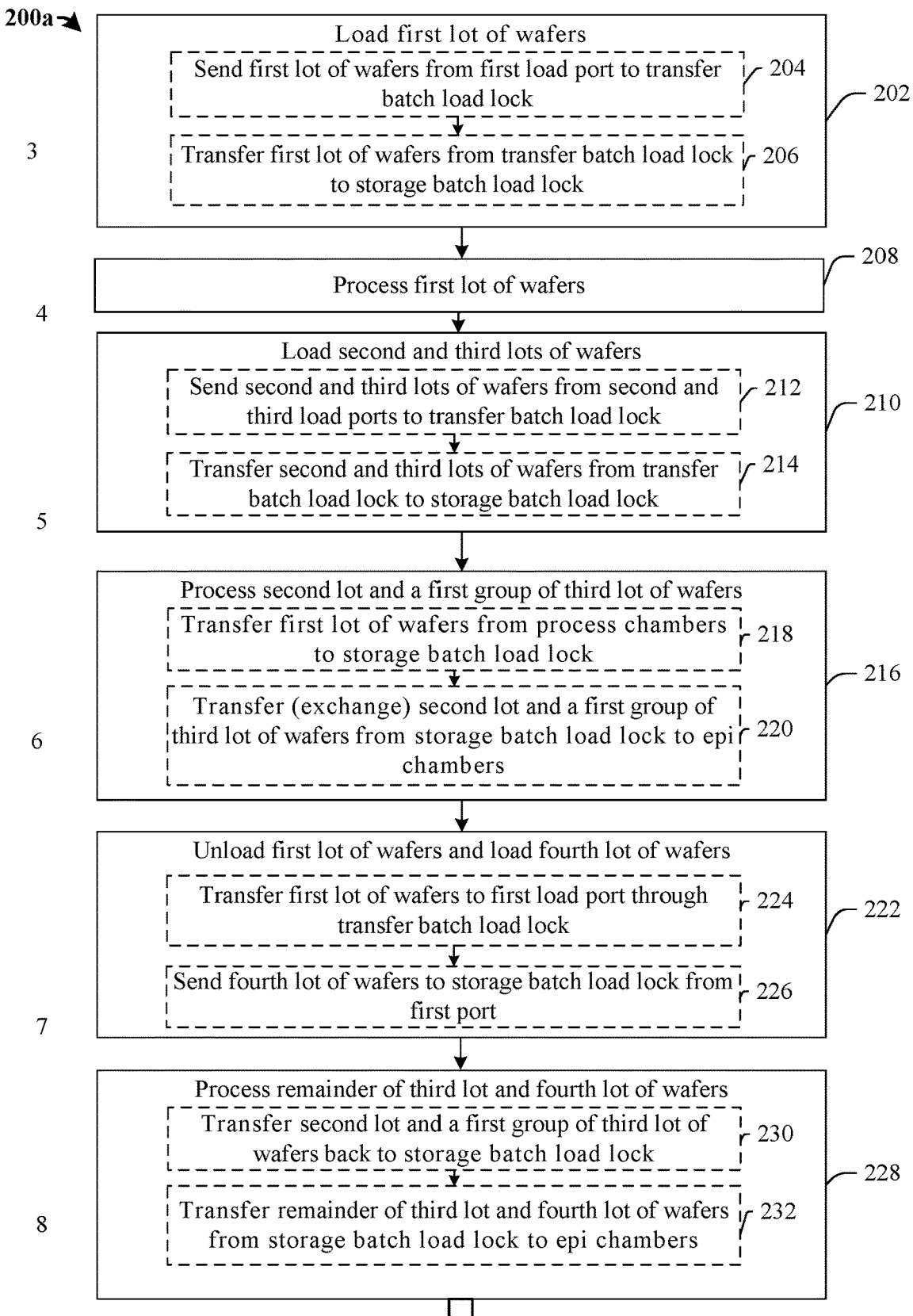
FIGS. 2A-2B show flow diagrams of a method of improving processing efficiency of a cluster tool in accordance with some embodiments.
Figure 2B:
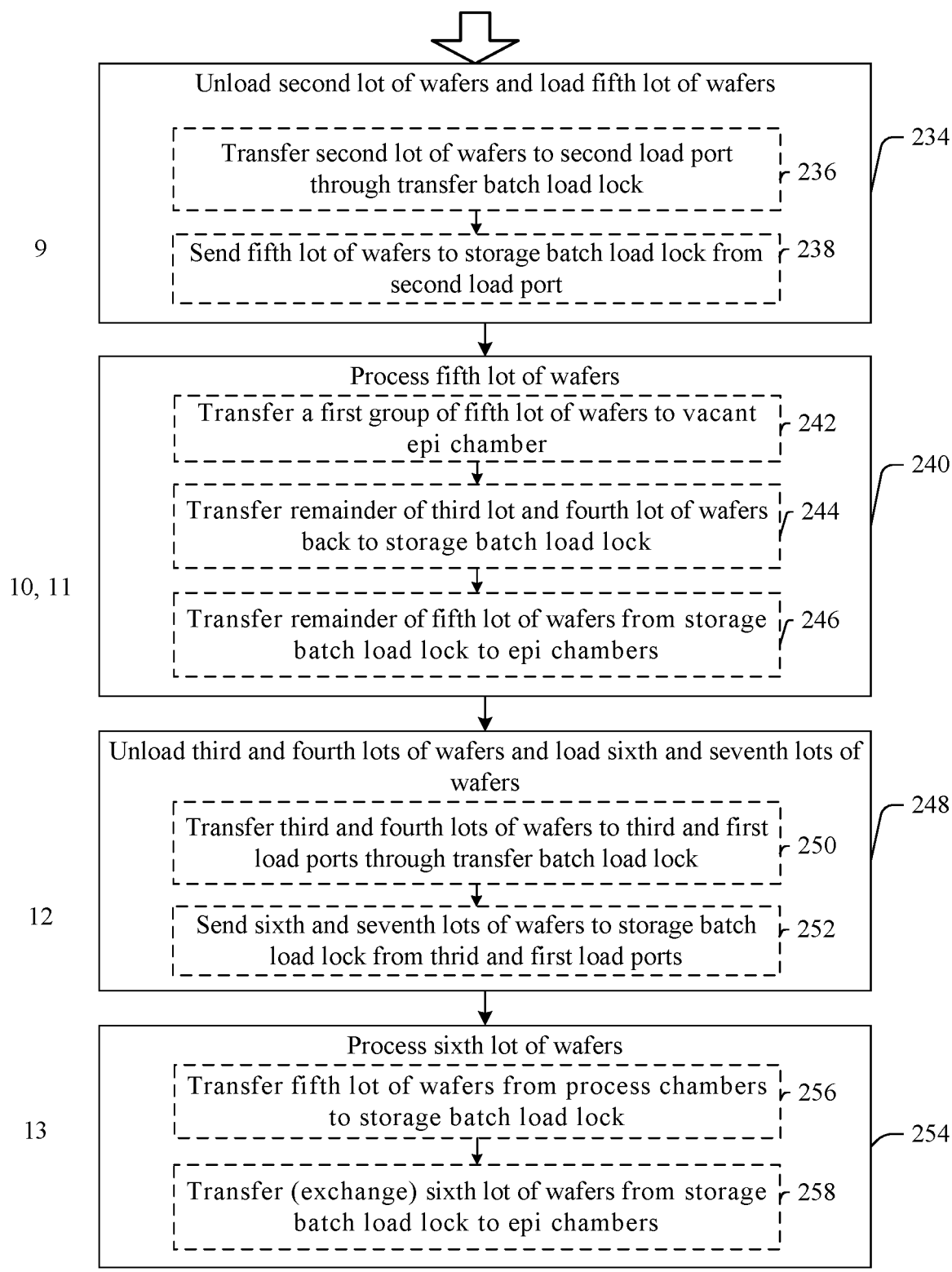

FIGS. 2A-2B show flow diagrams 200a, 200b of a method of improving processing efficiency of a cluster tool in accordance with some embodiments. In the flow diagram, as well as in the schematic views following, the cluster tool is described in the context of an epitaxial deposition cluster tool. It will be appreciated that this epitaxial deposition cluster tool, which includes a number of epitaxial deposition chambers, is a non-limiting example and other types of processing chambers, such as other deposition tools or etching tools are contemplated as falling within the scope of this disclosure.

While disclosed method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At action 202, as illustrated in action 204 and action 206 below, a first lot of wafers is loaded to a designated storage chamber.

At action 204, the first lot of wafers is sent from first load port to a transfer load lock.

At action 206, the first lot of wafers is transferred from the transfer load lock to the designated storage chamber.

At action 208, the first lot of wafers is processed in epitaxial deposition chambers.

At action 210, as illustrated in action 212 and action 214 below, second and third lots of wafers are loaded to the designated storage chamber.

At action 212, the second and third lots of wafers are sent from second and third load ports to the transfer load lock.

At action 214, the second and third lots of wafers are transferred from the transfer load lock to the designated storage chamber.

At action 216, as illustrated in action 218 and action 220 below, second lot and a first group of third lot of wafers are processed in epitaxial deposition chambers.

At action 218, first lot of wafers is transferred from process chambers to the designated storage chamber.

At action 220, second lot and a first group of third lot of wafers are transferred from the designated storage chamber to epitaxial deposition chambers.

At action 222, as illustrated in action 224 and action 226 below, first lot of wafers is unloaded from the cluster tool and fourth lot of wafers is loaded to the designated storage chamber.

At action 224, the first lot of wafers is transferred to the first load port through the transfer load lock.

At action 226, a fourth lot of wafers is sent to the designated storage chamber from first port through the transfer load lock.

At action 228, as illustrated in action 230 and action 232 below, the remainder of third lot and the fourth lot of wafers are processed in epitaxial deposition chambers.

At action 230, the second lot and the first group of third lot of wafers are transferred back to the designated storage chamber.

At action 232, the remainder of third lot and the fourth lot of wafers are transferred from the designated storage chamber to epitaxial deposition chambers.

At action 234, as illustrated in action 236 and action 238 below, the second lot of wafers is unloaded from the cluster tool and a fifth lot of wafers is loaded to the designated storage chamber.

At action 236, the second lot of wafers is transferred to the second load port through the transfer load lock.

At action 238, the fifth lot of wafers is sent to the designated storage chamber from the second port through the transfer load lock.

At action 240, as illustrated in action 242, action 244 and action 246 below, the fifth lot of wafers is processed in epitaxial deposition chambers.

At action 242, the first group of fifth lot of wafers is transferred to vacant epitaxial deposition chamber.

At action 244, the remainder of third lot and the fourth lot of wafers are transferred to the designated storage chamber from epitaxial deposition chambers.

At action 246, the remainder of fifth lot of wafers is transferred from the designated storage chamber to epitaxial deposition chambers.

At action 248, as illustrated in action 250 and action 252 below, the third and fourth lots of wafers are unloaded from the cluster tool and a sixth and seventh lots of wafers are loaded to the designated storage chamber.

At action 250, the third and fourth lots of wafers are transferred to the third and first load ports through the transfer load lock.

At action 252, the sixth and seventh lots of wafers are sent to the designated storage chamber from the third and first ports through the transfer load lock.

At action 254, as illustrated in action 256 and action 258 below, the sixth lot of wafers is processed in epitaxial deposition chambers.

At action 256, the fifth lot of wafers is transferred back to the designated storage chamber.

At action 258, the sixth lot of wafers is transferred from the designated storage chamber to epitaxial deposition chambers.

FIGS. 3-13 show a series of schematic views of a processing tool in different steps of wafer processing illustrating methods of improving epitaxial deposition processing efficiency in accordance with some embodiments. Although FIGS. 3-13 are described in relation to method 200, it will be appreciated that the structures disclosed in FIGS. 3-13 are not limited to such a method 200, but instead may stand alone as structures independent of the method. Similarly, although the method is described in relation to FIGS. 3-13, it will be appreciated that the method is not limited to the structures disclosed in FIGS. 3-13, but instead may stand alone independent of the structures disclosed in FIGS. 3-13.

Figure 3:
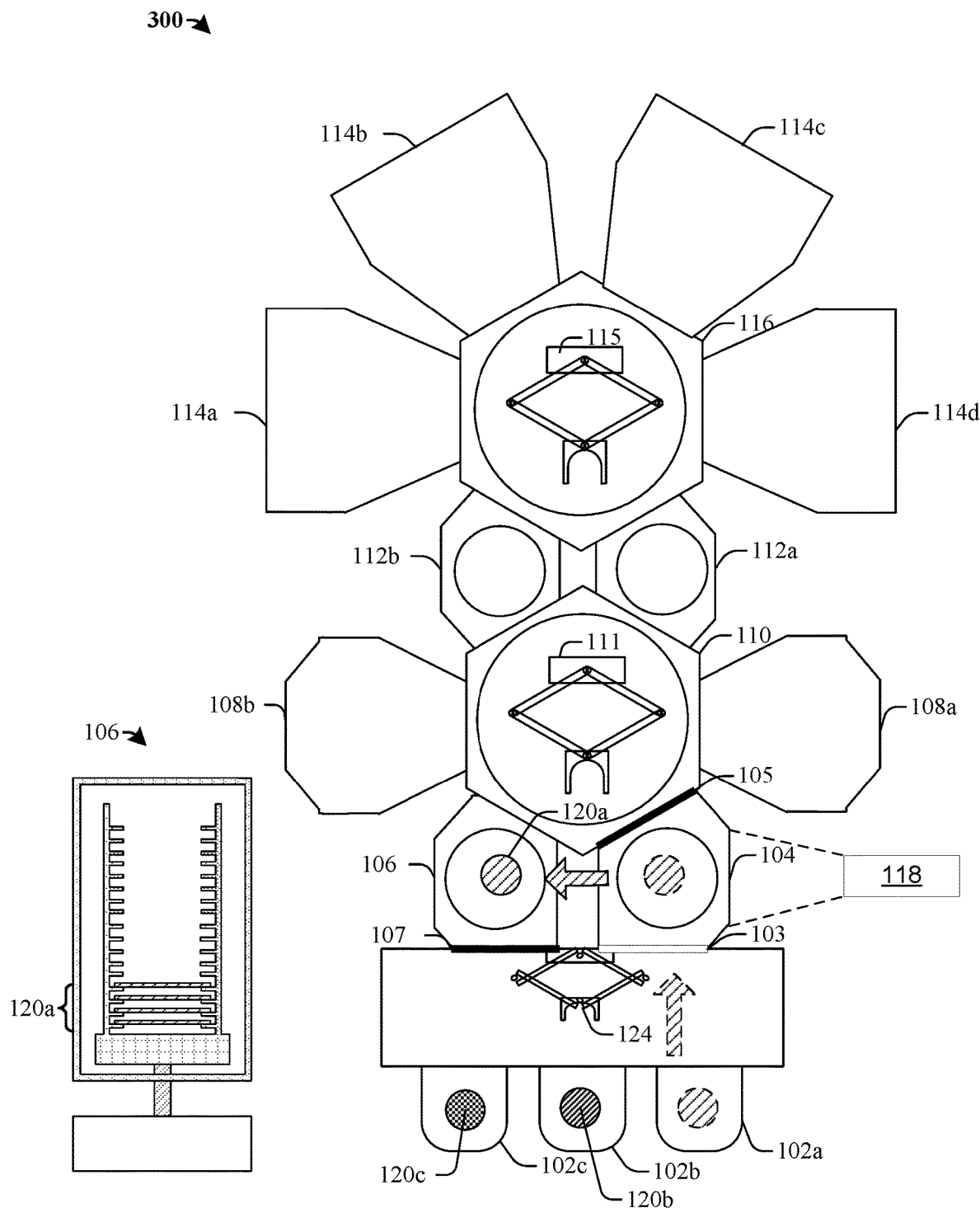
FIGS. 3-13 show a series of schematic views of a processing tool in different steps of wafer processing illustrating methods of improving epitaxial deposition processing efficiency in accordance with some embodiments.

FIG. 3 illustrates some embodiments of a schematic view 300 of a processing tool corresponding to action 202, action 204 and action 206.

As illustrated by schematic view 300, a first lot 120a of wafers is loaded to a designated storage chamber 106. First, an outer load lock portal 103 of the transfer load lock 104 is opened to have the first lot 120a of wafers sent from a first load port 102a to the transfer load lock 104 by a front end transfer robot 124. During this process an inner load lock portal 105 of the transfer load lock 104 remains closed to seal the processing tool from the ambient environment. Then, the outer load lock portal 103 is closed and the transfer load lock 104 is pumped to be closed to an internal environment of the processing tool. Then, the first lot 120a of wafers is transferred from the transfer load lock 104 to the designated storage chamber 106 by a first transfer robot 111 of the first transfer chamber 110.

Figure 4:
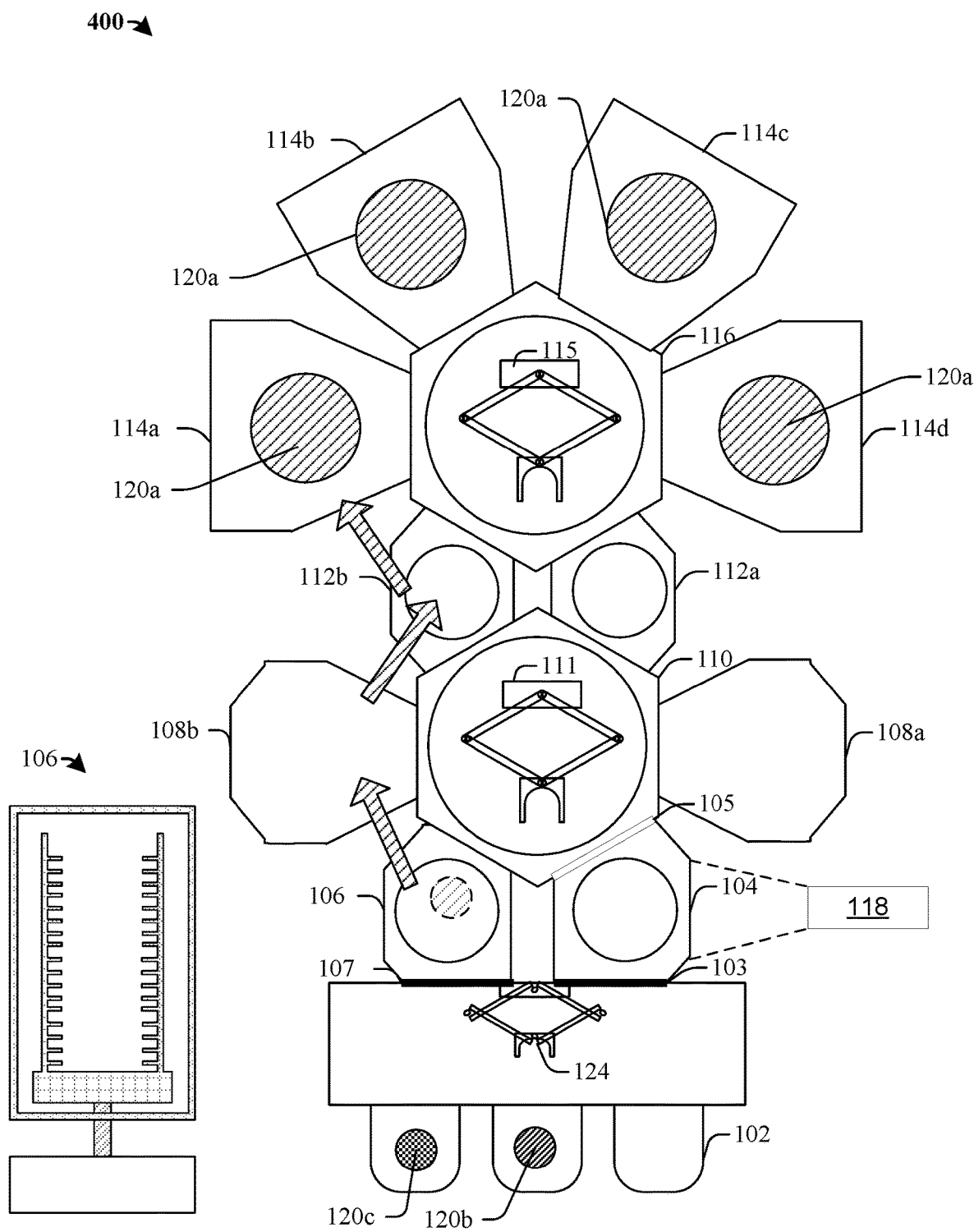

FIG. 4 illustrates some embodiments of a schematic view 400 of a processing tool corresponding to action 208.

As illustrated by schematic view 400, the first lot 120a of wafers is processed in epitaxial deposition chambers 114. In some embodiments, the epitaxial deposition chambers 114 can be a low-temperature or plasma-based chamber. The epitaxial deposition chambers 114 can be used for substrate formation or n-type or p-type doping layer formation. In some embodiments, prior to transferring to the epitaxial deposition chambers 114, the first lot 120a of wafers are transferred from the designated storage chamber 106 to a pre-clean chamber 108 for a pre-clean process and then transferred to a via connector chamber 112 by the first transfer robot 111. Then, the first lot 120a of wafers is transferred to the epitaxial deposition chambers 114 using a second transfer robot 115 of a second transfer chamber 116 after the pre-clean process for an epitaxial growth process. In some embodiments, four epitaxial deposition chambers 114a, 114b, 114c, 114d are attached to the second transfer chamber 116. In many instances, wafers 120 (e.g. the first lot 120a of wafers) can take the form of a disc-like wafer having a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. For purposes of illustration, examples are given for only one wafer being processed in an epitaxial deposition chamber at one time, which benefits uniformity of formed film, but processing multiple wafers a time is amenable. In some embodiments, the first lot 120a of wafers has four wafers respectively sent to the four epitaxial deposition chambers 114a, 114b, 114c and 114d in succession. In some other embodiments, the first lot 120a of wafers has eight wafers, and four of which are processed first and sent back and stay in the designated storage chamber 106 while the other four are sent to epitaxial deposition chambers 114 for processing.

Figure 5:
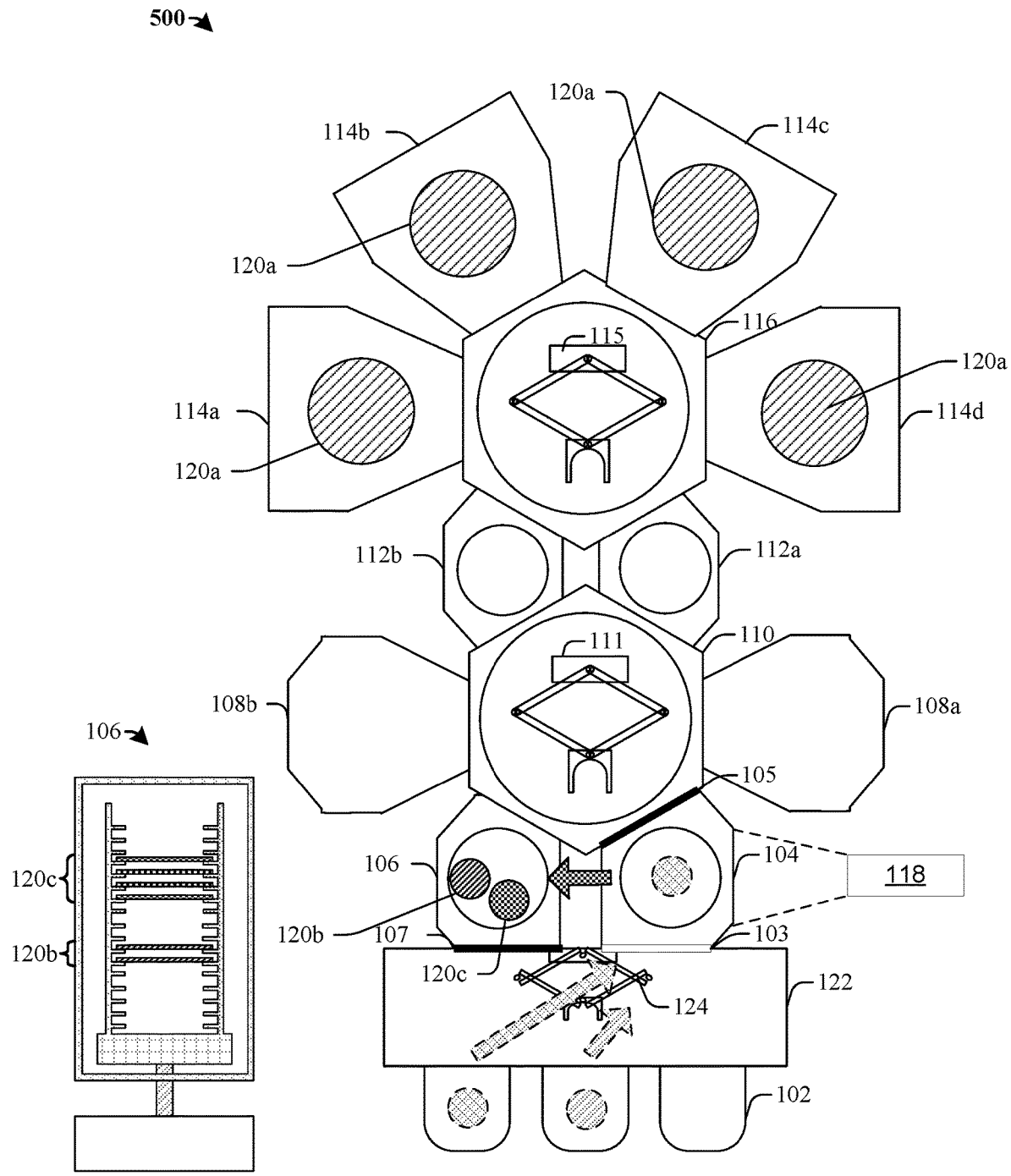

FIG. 5 illustrates some embodiments of a schematic view 500 of a processing tool corresponding to action 210, action 212 and action 214.

As illustrated by schematic view 500, a second lot 120b and a third lot 120c of wafers are loaded to the designated storage chamber 106. In this example, the second lot 120b is a partial lot having two wafers and the third lot 120c has four wafers. Similar as above loading process of the first lot 120a, the second lot 120b and third lot 120c of wafers are sent from second load port 102b and third load port 102c by a front end transfer robot 124 arranged in a front end interface 122, to the transfer load lock 104, which is sealed from cluster tool environment by the inner load lock portal 105. Then, the transfer load lock is sealed from the front end interface 122 by closing the outer load lock portal 103, and the transfer load lock 104 is pumped to make a pressure of the transfer load lock to be close to the cluster tool environment. Then, the transfer load lock 104 is opened to the cluster tool environment and the second lot 120b and third lot 120c of wafers are transferred from the transfer load lock 104 to the designated storage chamber 106 by the first transfer robot 111.

Figure 6:
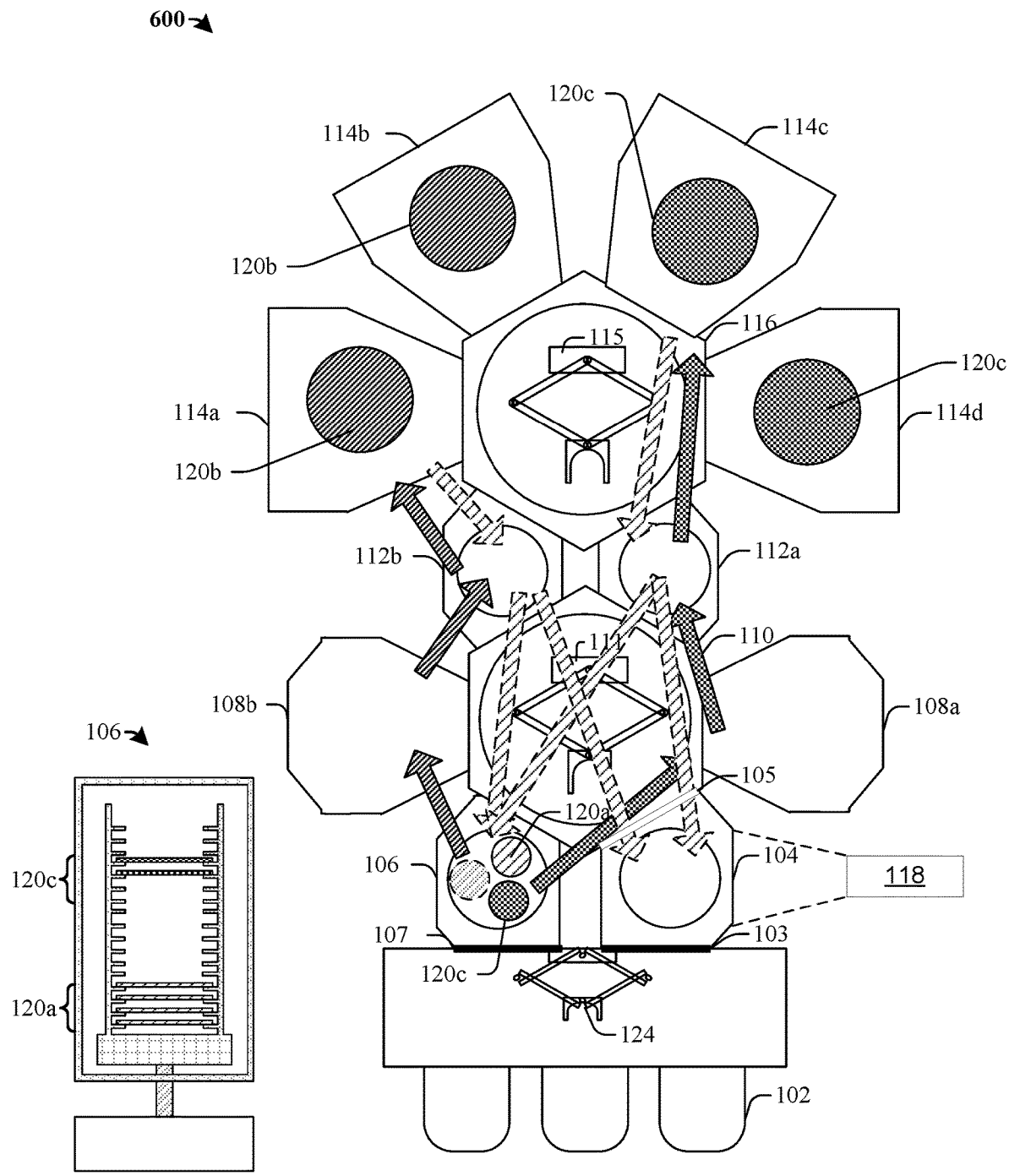

FIG. 6 illustrates some embodiments of a schematic view 600 of a processing tool corresponding to action 216, action 218 and action 220.

As illustrated by schematic view 600, the second lot 120b and a first group of third lot 120c of wafers are processed in epitaxial deposition chambers 114. The first lot 120a of wafers is transferred from epitaxial deposition chambers 114 to the designated storage chamber 106. Two wafers of the second lot 120b are exchanged with two wafers of the first lot of wafers to be processed in a first epitaxial deposition chamber 114a and a second epitaxial deposition chamber 114b. A first two wafers of third lot 120c are transferred from the designated storage chamber 106 to exchange with the other two wafers of the first lot 120a to be processed in a third epitaxial deposition chamber 114c and a fourth epitaxial deposition chamber 114d.

Figure 7:
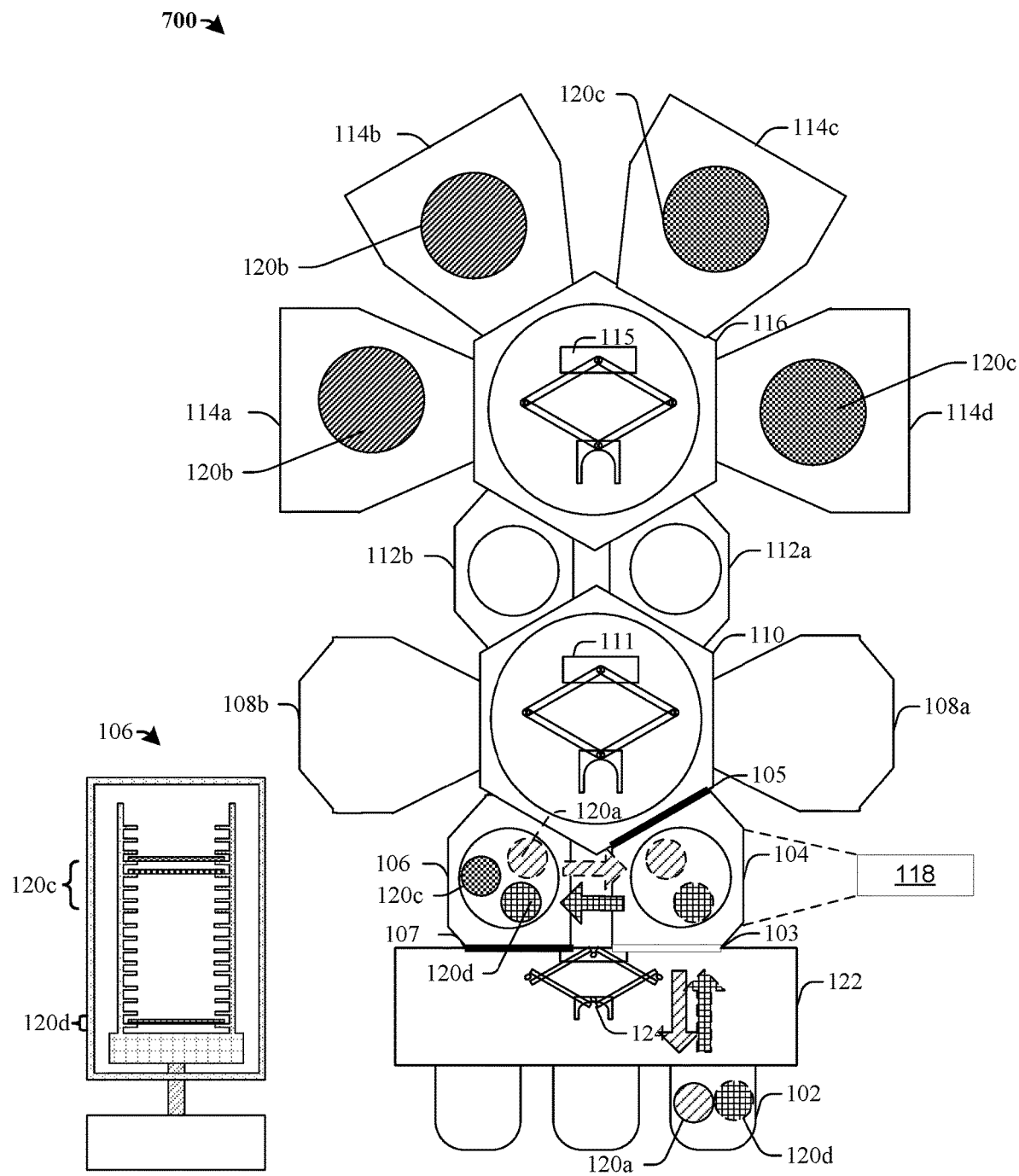

FIG. 7 illustrates some embodiments of a schematic view 700 of a processing tool corresponding to action 222, action 224 and action 226.

As illustrated by schematic view 700, the first lot 120a of wafers is unloaded from the cluster tool and in exchange a fourth lot 120d of wafers is loaded to the designated storage chamber 106. The inner load lock portal 105 of the transfer load lock 104 is opened and the first lot 120a of wafers is transferred to the transfer load lock 104 by the first transfer robot 111. Then the transfer load lock 104 is sealed from cluster tool environment by closing the inner load lock portal 105 and opened to the front end interface 122. The first lot 120a of wafers is transferred to the first load port 102a through the transfer load lock 104. The fourth lot 120d of wafers is sent to the designated storage chamber 106 from the first load port 102a through the transfer load lock 104. In this example, the fourth lot 120d is a partial lot has only one wafer.

Figure 8:
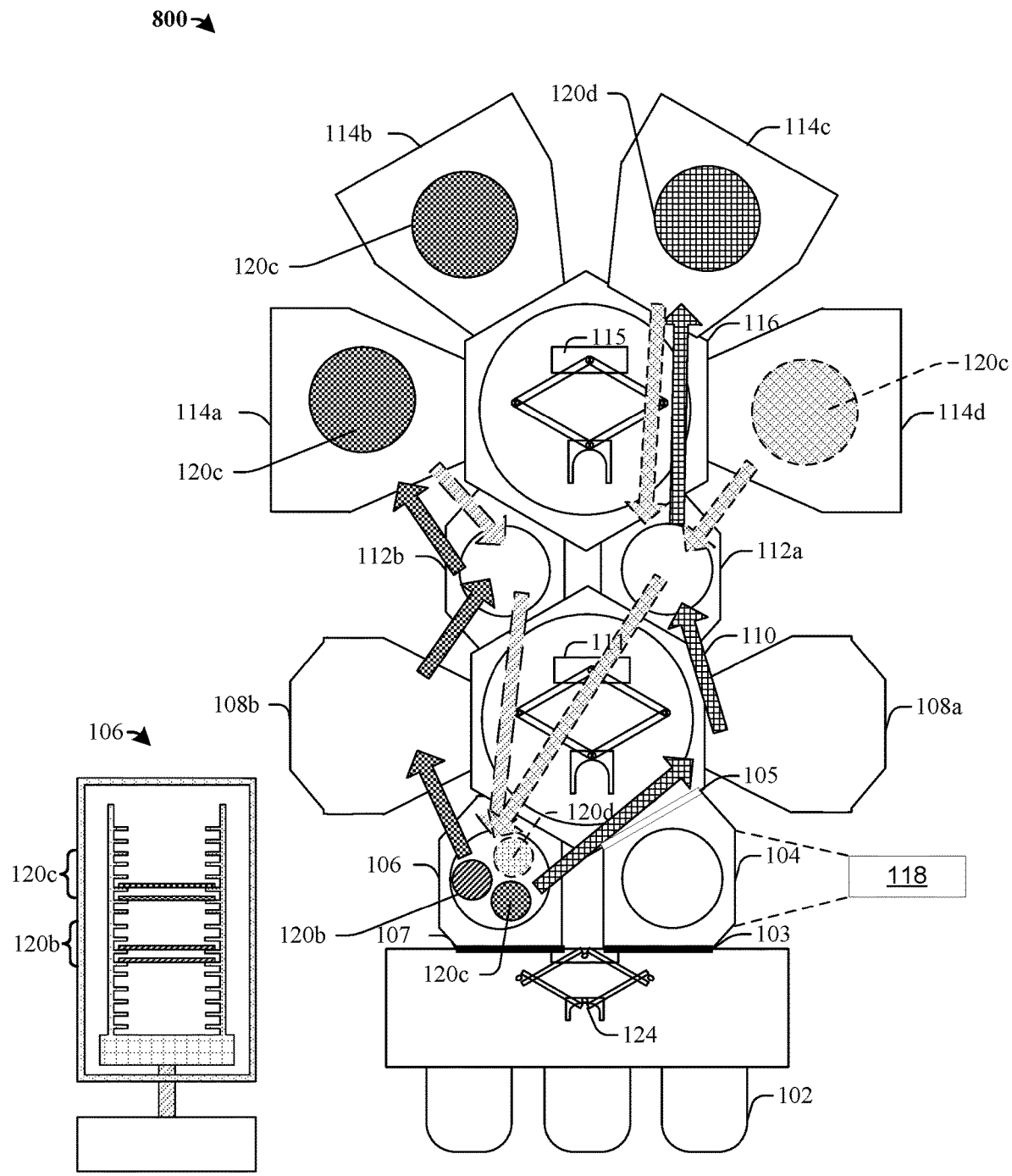

FIG. 8 illustrates some embodiments of a schematic view 800 of a processing tool corresponding to action 228, action 230 and action 232.

As illustrated by schematic view 800, remaining wafers of the third lot 120c and the wafer of the fourth lot 120d of wafers are processed in epitaxial deposition chambers 114. Wafers of the second lot 120b are transferred back to the designated storage chamber 106 in succession from the first epitaxial deposition chamber 114a and the second epitaxial deposition chamber 114b, in exchange with the remaining two wafers of the third lot 120c. And the first two wafers of third lot of wafers are transferred back to the designated storage chamber 106 in succession from the third epitaxial deposition chamber 114c and the fourth epitaxial deposition chamber 114d. The wafer of the fourth lot 120d is transferred from the designated storage chamber 106 to the third epitaxial deposition chamber 114c. The fourth epitaxial deposition chamber 114d stays vacant until the second lot 120b is sent out to exchange more wafers in to the designated storage chamber 106 for processing.

Figure 9:
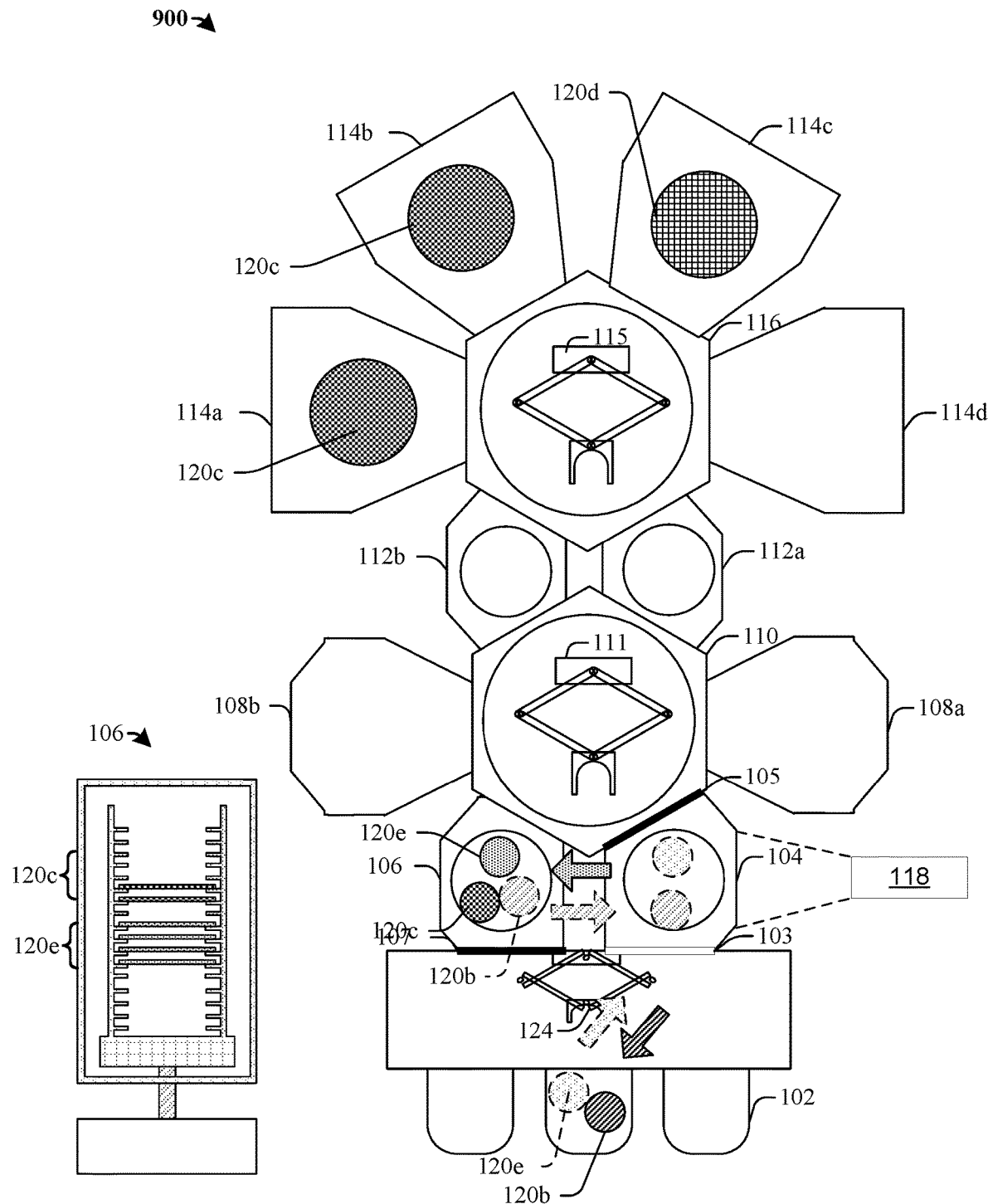

FIG. 9 illustrates some embodiments of a schematic view 900 of a processing tool corresponding to action 234, action 236 and action 238.

As illustrated by schematic view 900, the second lot 120b of wafers is unloaded from the cluster tool and in exchange a fifth lot 120f of wafers is loaded to the designated storage chamber 106. The second lot 120b of wafers is transferred to the second load port 102b through the transfer load lock 104. The fifth lot 120f of wafers is sent to the designated storage chamber 106 from the second load port 102b through the transfer load lock 104. In this example, the fifth lot 120e is a full lot having four or eight wafers.

Figure 10:
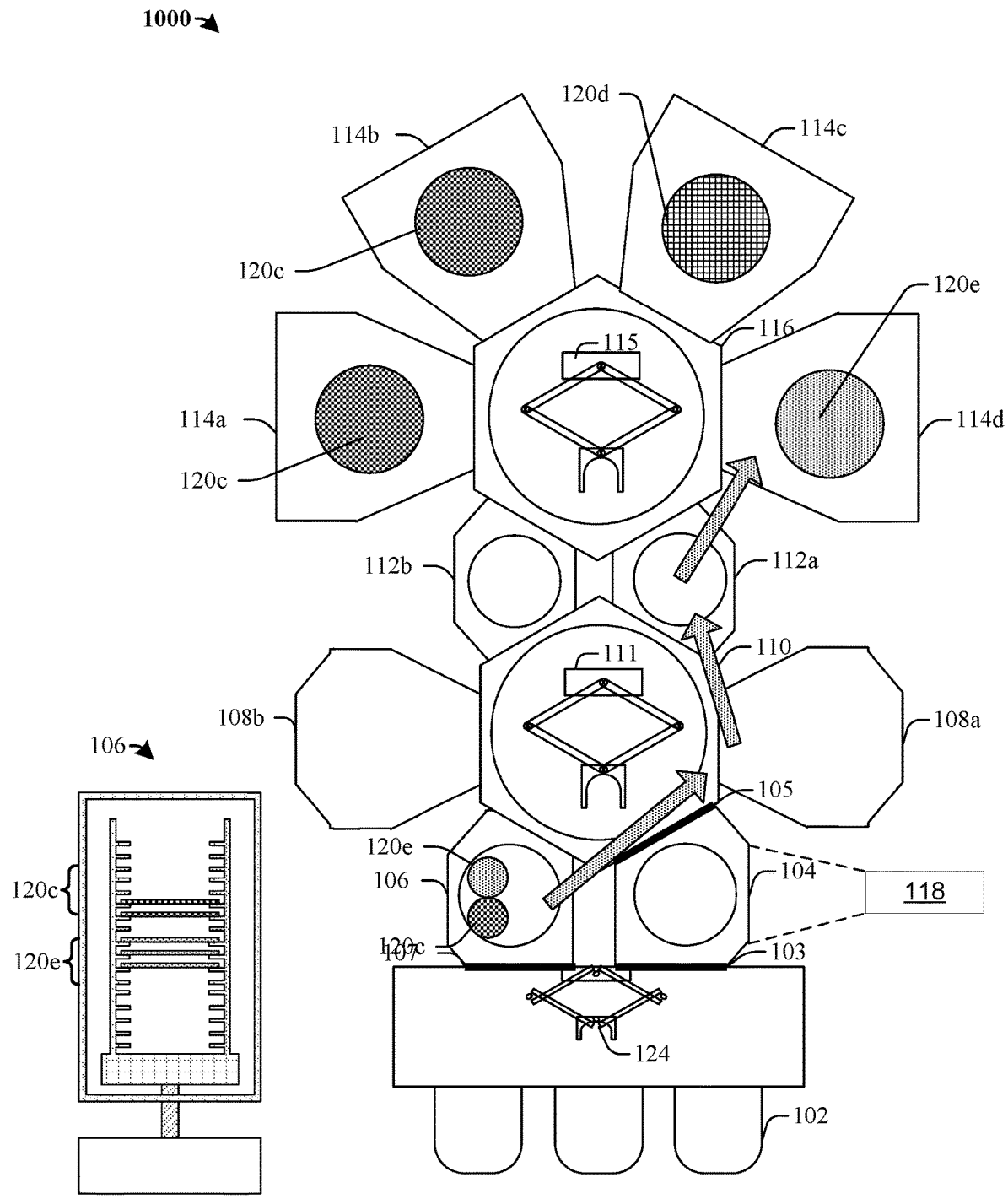
Figure 11:
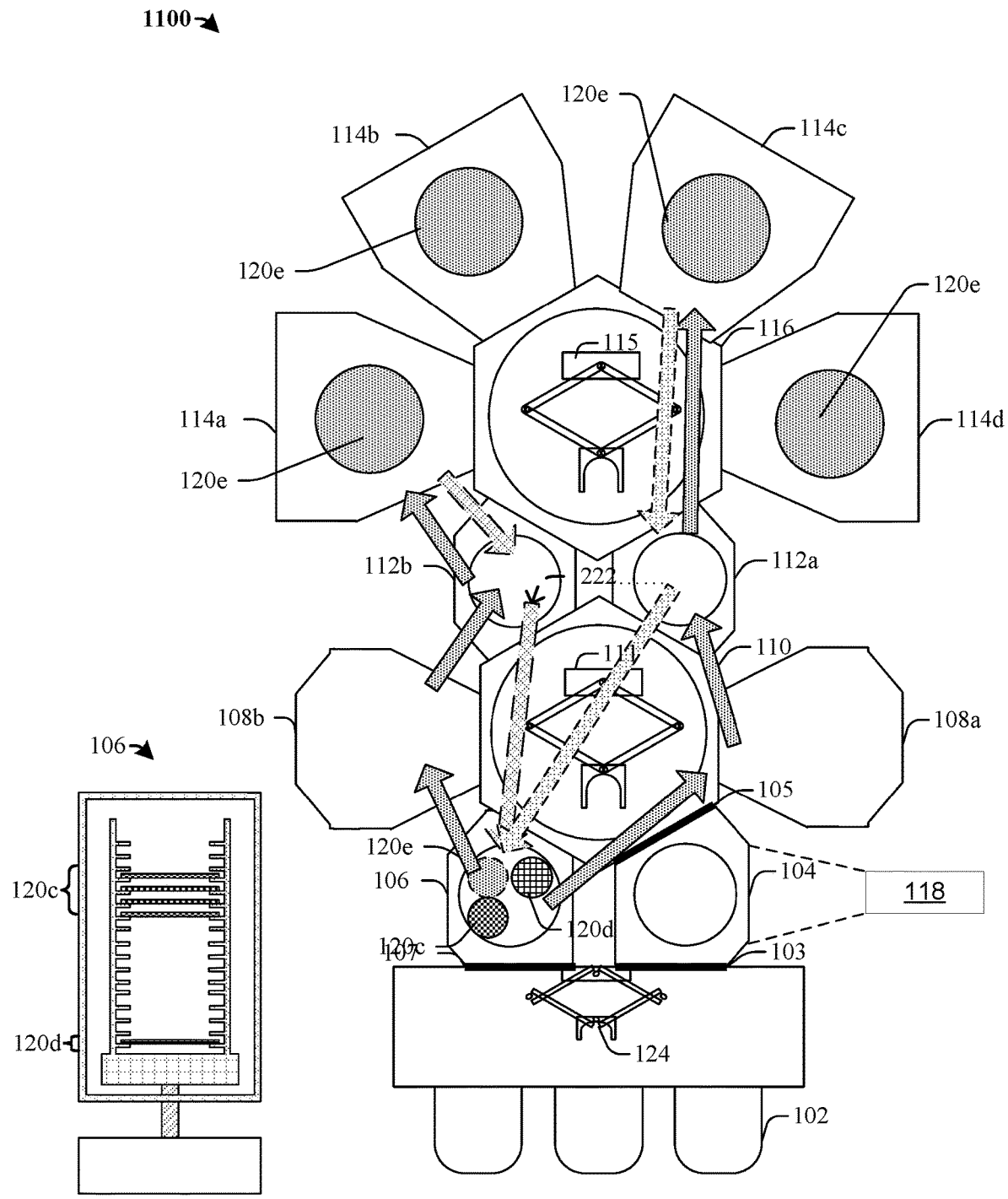

FIGS. 10-11 illustrate some embodiments of schematic views 1000, 1100 of a processing tool corresponding to action 240, action 242, action 244 and action 246.

As illustrated by schematic views 1000 and 1100, the fifth lot 120e of wafers is processed in epitaxial deposition chambers 114. As illustrated by schematic view 1000, the first one of the fifth lot 120e is first transferred to the vacant fourth epitaxial deposition chamber 114d. As illustrated by schematic view 1100, then the remaining two wafers of the third lot 120c and the one wafer of fourth lot 120d are transferred back to the designated storage chamber 106, in exchange the remaining two of the fifth lot 120e of wafers to first, second and third epitaxial deposition chambers 114a-114c.

Figure 12:
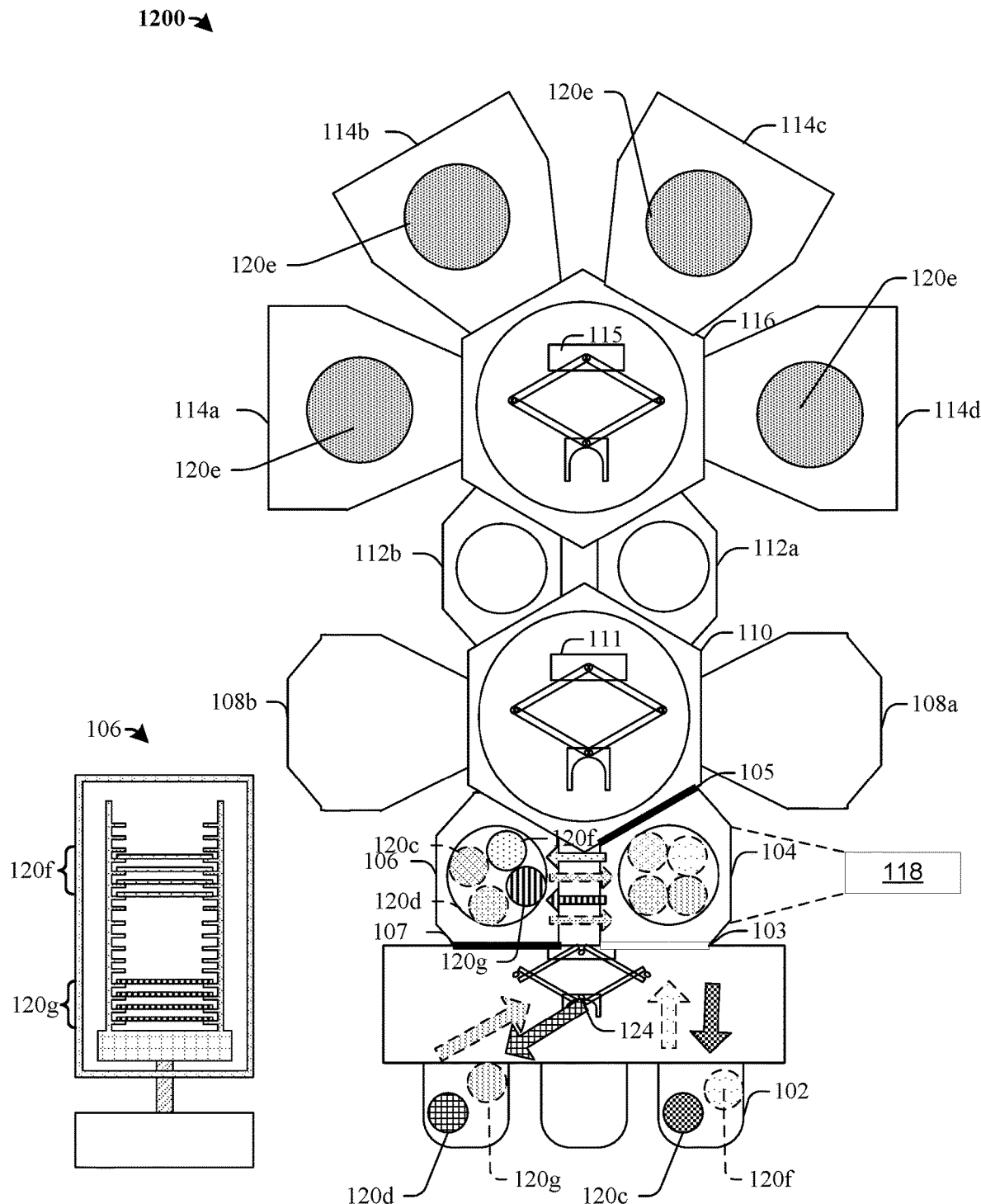

FIG. 12 illustrates some embodiments of a schematic view 1200 of a processing tool corresponding to action 248, action 250 and action 252.

As illustrated by schematic view 1200, the third lot 120c and the fourth lot 120d of wafers are unloaded from the cluster tool and in exchange a sixth lot 120f and a seventh lot 120g of wafers are loaded to the designated storage chamber 106. The third lot 120c and the fourth lot 120d of wafers are transferred to the third load port 102c and the first load port 102a through the transfer load lock 104 together in a batch. The sixth lot 120f and a seventh lot 120g of wafers are sent to the designated storage chamber 106 from the third load port 102c and the first load port 102a through the transfer load lock 104 together in a batch.

Figure 13:
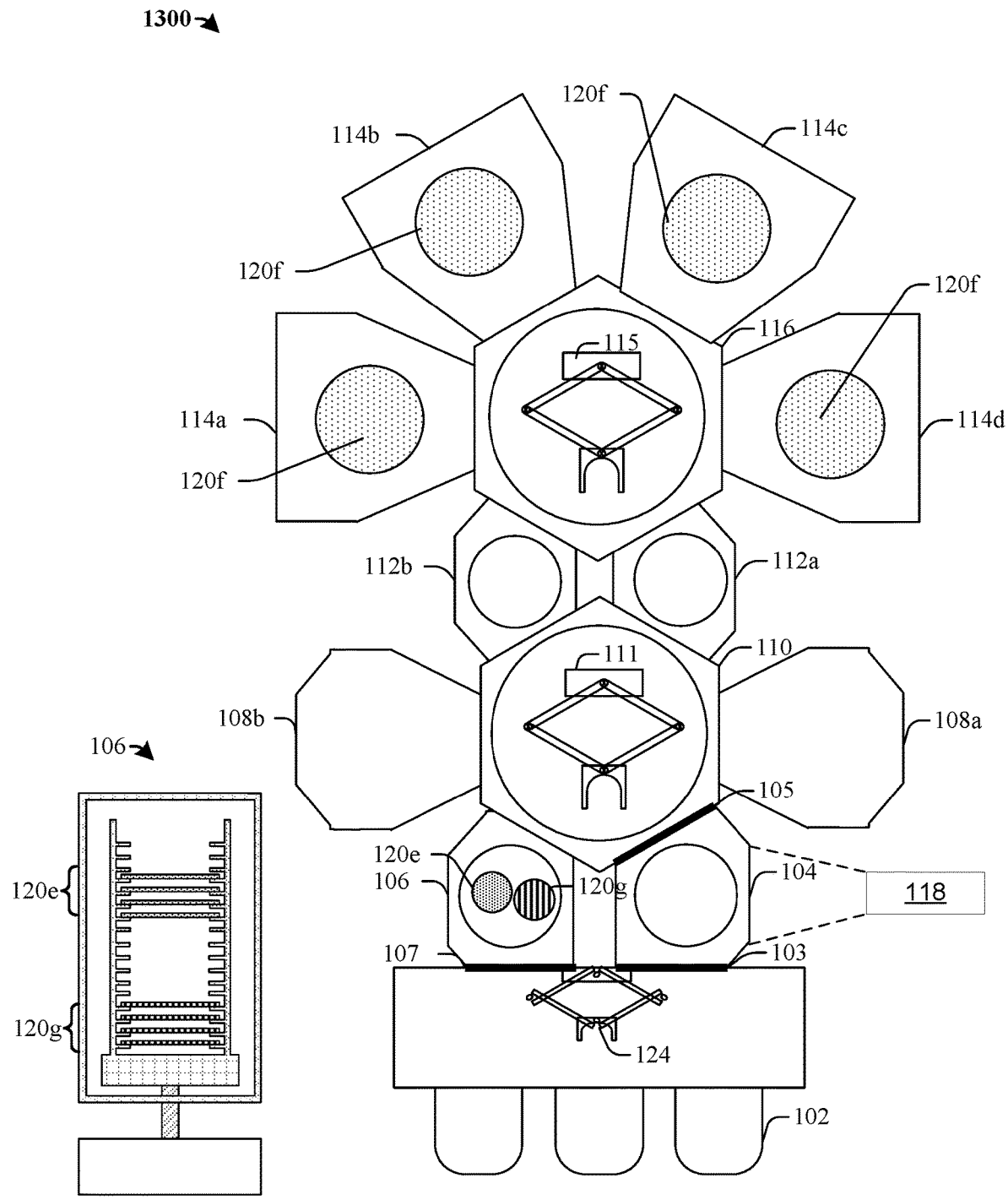

FIG. 13 illustrates some embodiments of a schematic view 1300 of a processing tool corresponding to action 254, action 256 and action 258.

As illustrated by schematic view 1300, the sixth lot 120f of wafers is processed in epitaxial deposition chambers. The fifth lot 120e of wafers is transferred back to the designated storage chamber 106. The sixth lot of wafers is transferred from the designated storage chamber 106 to the pre-clean chamber 108 and to epitaxial deposition chambers 114. More wafers can then be processed using similar mechanics.

Thus, the present disclosure relates to optimized techniques to improve epitaxial deposition processing efficiency and queue time. The wafers are sent to a cluster tool by small lots having less than ten wafers in each lot. The lots of wafers are sent to a transfer load lock from a front end interface first. Then the lots of wafers are transferred to a designated storage chamber to wait for processing. Multiple lots of wafers can be stored in the designated storage chamber for processing, and the lots of wafers can be transferred in and out the tool system separately. Thus, improved queue time and efficiency can be achieved.

In some embodiments, the present disclosure relates to a method for improving processing efficiency of a cluster tool. The method comprises transferring a first lot of wafers from a first load port to a transfer load lock at a first time of loading. The transfer load lock has an outer load lock portal on a sidewall of a front end interface and an inner load lock portal facing a first transfer chamber. The method further comprises transferring a second lot of wafers from a second load port to the transfer load lock through the outer load lock portal with the first lot of wafers in the transfer load lock. The first lot of wafers and the second lot of wafers define a set of transferring wafers. The method further comprises transferring the set of transferring wafers to a designated storage load lock through the first transfer chamber, wherein the designated storage load lock also has an outer load lock portal on the sidewall of the front end interface and an inner load lock portal facing a first transfer chamber and transferring a first group of the set of transferring wafers from the designated storage load lock to a pre-clean chamber for a pre-clean process through the first transfer chamber using the first transfer robot. The method further comprises transferring the first group of transferring wafers from the pre-clean chamber to an epitaxial deposition chamber for an epitaxial growth process through a second transfer chamber and transferring the set of transferring wafers back to the designated storage load lock. The method further comprises transferring the set of transferring wafers from the designated storage load lock to the transfer load lock and moving the set of transferring wafers out of the cluster tool at a second time of unloading. The outer load lock portal of the designated storage load lock is retained fixedly closed from the first time of loading to the second time of unloading. The inner load lock portal of the designated storage load lock is retained fixedly open from the first time of loading to the second time of unloading.

In other embodiments, the present disclosure relates to a method for improving processing efficiency of a cluster tool. The method comprises sending a first lot of wafers from a first load port to a transfer load lock in a cluster tool and transferring the first lot of wafers from the transfer load lock to a designated storage load lock through a first transfer chamber in the cluster tool. The method further comprise sending a second lot of wafers from a second load port to the transfer load lock and transferring the second lot of wafers from the transfer load lock to the designated storage load lock through the first transfer chamber while the first lot of wafers is in the transfer load lock or the designated storage load lock. The designated storage load lock has the same structure as the transfer load lock and respectively has an inner load lock portal at an interface with the first transfer chamber. The inner load lock portal of the designated storage load lock is retained opened during processing. The designated storage load lock and the transfer load lock respectively has an outer load lock portal on a sidewall of a front end interface. The outer load lock portal of the designated storage load lock is retained closed during processing.

In yet other embodiments, the present disclosure relates to a method for improving processing efficiency of a cluster tool. The method comprises providing a plurality of wafer carriers to a front end interface of a cluster tool, wherein each of the plurality of wafer carriers holds a lot of wafers and transferring N+1 or more lots of wafers from the front end interface to a transfer load lock. The method further comprises transferring the N+1 or more lots of wafers from the transfer load lock to a designated storage load lock in the cluster tool such that the N+1 or more lots of wafers are present in the cluster tool at the same time. N is an amount of wafer carriers in the front end interface, wherein the N+1 or more lots of wafers transferred to the designated storage load lock form initial lots of wafers. The method further comprises transferring a first group of wafers of the initial lots of wafers from the designated storage load lock to a pre-clean chamber in the cluster tool for a pre-clean process and transferring the first group of wafers of the initial lots of wafers to an epitaxial deposition chamber in the cluster tool after the pre-clean process. The method further comprises transferring the first group of wafers of the initial lots of wafers to the designated storage load lock after the first group of wafers of the initial lots of wafers has passed through the epitaxial deposition chamber and transferring the first group of wafers of the initial lots of wafers from the designated storage load lock back to the transfer load lock. The method further comprises sending the first group of wafers of the initial lots of wafers out of the cluster tool from the transfer load lock. The designated storage load lock has the same structure as the transfer load lock, and wherein the designated storage load lock and the transfer load lock respectively has an inner load lock portal and an outer load lock portal on a sidewall of the front end interface. The outer load lock portal of the designated storage load lock is retained fixedly closed during loading, unloading and processing the wafer; and wherein the inner load lock portal of the designated storage load lock is retained opened during loading, unloading and processing the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for processing wafers in a cluster tool, comprising:
   transferring a first lot of wafers from a first load port to a transfer load lock at a first time of loading, wherein the transfer load lock has an outer load lock portal on a sidewall of a front end interface and an inner load lock portal facing a first transfer chamber;
   transferring a second lot of wafers from a second load port to the transfer load lock through the outer load lock portal with the first lot of wafers in the transfer load lock, wherein the first lot of wafers and the second lot of wafers define a set of transferring wafers;
   transferring the set of transferring wafers to a designated storage load lock through the first transfer chamber, wherein the designated storage load lock also has an outer load lock portal on the sidewall of the front end interface and an inner load lock portal facing a first transfer chamber;
   transferring a first group of the set of transferring wafers from the designated storage load lock to a pre-clean chamber for a pre-clean process through the first transfer chamber using a first transfer robot;
   transferring the first group of transferring wafers from the pre-clean chamber to an epitaxial deposition chamber for an epitaxial growth process through a second transfer chamber;
   transferring the set of transferring wafers back to the designated storage load lock;
   transferring the set of transferring wafers from the designated storage load lock to the transfer load lock; and
   moving the set of transferring wafers out of the cluster tool at a second time of unloading;
   wherein the outer load lock portal of the designated storage load lock is retained fixedly closed from the first time of loading to the second time of unloading; and
   wherein the inner load lock portal of the designated storage load lock is retained fixedly open from the first time of loading to the second time of unloading.

2. The method according to claim 1, further comprising:
   transferring the first group of the set of transferring wafers from the epitaxial deposition chamber to a via connector chamber after the epitaxial growth process through the second transfer chamber;
   transferring the first group of transferring wafers from the via connector chamber to the designated storage load lock through the first transfer chamber;
   transferring the first group of transferring wafers from the designated storage load lock to the transfer load lock through the first transfer chamber; and
   sending the first group of transferring wafers out of the cluster tool from the transfer load lock.

3. The method according to claim 1, further comprising:
   removing the first group of transferring wafers from the epitaxial deposition chamber;
   sending a third lot of wafers in the cluster tool from the transfer load lock to the designated storage load lock while at least some of the set of transferring wafers remain in the designated storage load lock; and
   transferring the remaining transferring wafers and at least some wafers of the third lot of wafers from the designated storage load lock to the epitaxial deposition chamber.

4. The method according to claim 3, wherein an outer load lock portal of the designated storage load lock is retained fixedly closed during processing of the first, second and third lots of wafers.

5. A method, comprising:
   sending a first lot of wafers from a first load port to a transfer load lock in a cluster tool;
   transferring the first lot of wafers from the transfer load lock to a designated storage load lock through a first transfer chamber in the cluster tool;
   sending a second lot of wafers from a second load port to the transfer load lock; and
   transferring the second lot of wafers from the transfer load lock to the designated storage load lock through the first transfer chamber while the first lot of wafers is in the transfer load lock or the designated storage load lock;
   wherein the designated storage load lock has the same structure as the transfer load lock and respectively has an inner load lock portal at an interface with the first transfer chamber, wherein the inner load lock portal of the designated storage load lock is retained opened during processing;
   wherein the designated storage load lock and the transfer load lock respectively has an outer load lock portal on a sidewall of a front end interface, wherein the outer load lock portal of the designated storage load lock is retained closed during processing.

6. The method of claim 5, further comprising:
   sending a third lot of wafers from the transfer load lock to the designated storage load lock while at least some wafers of the second lot of wafers remain in the designated storage load lock.

7. The method of claim 6, wherein each of the first, second and third lots contains eight wafers or less.

8. The method of claim 6, wherein each of the first, second and third lots contains four wafers or less.

9. The method of claim 6, further comprising:
transferring the second lot of wafers in succession from the designated storage load lock to an epitaxial processing chamber comprising a plurality of epitaxial processing chambers through a pre-clean chamber attached to a first transfer chamber; and
transferring a first group of the third lot of wafers in succession from the designated storage load lock to vacant epitaxial deposition chambers through the pre-clean chamber attached to the first transfer chamber while the second lot of wafers is being processed in the epitaxial processing chamber.

10. The method of claim 9, further comprising:
transferring the second lot of wafers and the first group of the third lot of wafers in succession from the epitaxial processing chamber to the designated storage load lock;
transferring a second group of the third lot of wafers in succession from the designated storage load lock to vacant epitaxial processing chambers through the pre-clean chamber attached to the first transfer chamber; and
transferring the second lot of wafers from the designated storage load lock to the transfer load lock while the first group of the third lot of wafers is disposed in the designated storage load lock.

11. The method of claim 5, further comprising:
transferring the first lot of wafers and the second lot of wafers in succession from the designated storage load lock to the transfer load lock; and
sending the first lot of wafers and the second lot of wafers out of the cluster tool in succession from the transfer load lock to the first and second load ports respectively.

12. The method of claim 11, further comprising:
sending a third lot of wafers and a fourth lot of wafers into the cluster tool respectively from the first and second load ports to the transfer load lock;
sealing the transfer load lock and opening the transfer load lock to an ambient environment external to the cluster tool; and
transferring the third lot of wafers and the fourth lot of wafers in succession from the transfer load lock to the designated storage load lock.

13. The method of claim 5, further comprising:
transferring the first lot of wafers from the designated storage load lock to a pre-clean chamber for a pre-clean process;
transferring the first lot of wafers to an epitaxial deposition chamber after the pre-clean process for an epitaxial growth process;
transferring the first lot of wafers to the designated storage load lock after the epitaxial growth process; and
transferring the first lot of wafers from the designated storage load lock to the transfer load lock.

14. A method, comprising:
providing a plurality of wafer carriers to a front end interface of a cluster tool, wherein each of the plurality of wafer carriers holds a lot of wafers;
transferring N+1 or more lots of wafers from the front end interface to a transfer load lock;
transferring the N+1 or more lots of wafers from the transfer load lock to a designated storage load lock in the cluster tool such that the N+1 or more lots of wafers are present in the cluster tool at the same time, wherein N is an amount of wafer carriers in the front end interface, wherein the N+1 or more lots of wafers transferred to the designated storage load lock form initial lots of wafers;
transferring a first group of wafers of the initial lots of wafers from the designated storage load lock to a pre-clean chamber in the cluster tool for a pre-clean process;
transferring the first group of wafers of the initial lots of wafers to an epitaxial deposition chamber in the cluster tool after the pre-clean process;
transferring the first group of wafers of the initial lots of wafers to the designated storage load lock after the first group of wafers of the initial lots of wafers has passed through the epitaxial deposition chamber;
transferring the first group of wafers of the initial lots of wafers from the designated storage load lock back to the transfer load lock; and
sending the first group of wafers of the initial lots of wafers out of the cluster tool from the transfer load lock;
wherein the designated storage load lock has the same structure as the transfer load lock, and wherein the designated storage load lock and the transfer load lock respectively has an inner load lock portal and an outer load lock portal on a sidewall of the front end interface;
wherein the outer load lock portal of the designated storage load lock is retained fixedly closed during loading, unloading and processing the wafer; and
wherein the inner load lock portal of the designated storage load lock is retained opened during loading, unloading and processing the wafer.

15. The method according to claim 14, further comprising:
exchanging a first one of the wafer carriers of the plurality of wafer carriers with a first new wafer carrier comprising a first new lot of wafers;
sending the first new lot of wafers in the cluster tool from the transfer load lock to the designated storage load lock while some of the wafers of the initial lots of wafers are still in the cluster tool;
exchanging a second one of the wafer carriers of the plurality of wafer carriers with a second new wafer carrier comprising a second new lot of wafers;
sending the second new lot of wafers in the cluster tool from the transfer load lock to the designated storage load lock while at least some wafers of the first new lot of wafers remain in the designated storage load lock; and
transferring the first new lot and at least some wafers of the second new lot respectively from the designated storage load lock to epitaxial deposition chambers in succession.

16. The method of claim 15, wherein each of the lots include less than ten wafers.

17. The method according to claim 15, further comprising:
sending the first new lot of wafers out of the cluster tool from the transfer load lock while the second new lot of wafers remains in the epitaxial deposition chambers.

18. The method according to claim 14, further comprising:
exchanging a first one of the wafer carriers of the plurality of wafer carriers with a first new wafer carrier comprising a first new lot of wafers and a second one of the wafer carriers of the plurality of wafer carriers with a second new wafer carrier comprising a second new lot of wafers;

sending the first new lot and the second new lot of wafers in the cluster tool from the transfer load lock to the designated storage load lock while the first group of wafers of the initial lot of wafers is still in the cluster tool;

transferring the first new lot and a first group of the second new lot of wafers respectively from the designated storage load lock to epitaxial deposition chambers in succession while at least remaining wafers of the second new lot of wafers are still sitting in the designated storage load lock; and sending the first new lot of wafers out of the cluster tool from the transfer load lock while the first group of the second new lot of wafers remain in the designated storage and the remaining wafers of the second new lot are processed in the epitaxial deposition chambers.

19. The method according to claim 14, further comprising:

exchanging a first one of the wafer carriers of the plurality of wafer carriers with a first new wafer carrier comprising a first new lot of wafers and a second one of the wafer carriers of the plurality of wafer carriers with a second new wafer carrier comprising a second new lot of wafers;

sending the first new lot and the second new lot of wafers in the cluster tool from the transfer load lock to the designated storage load lock while the first group of wafers of the initial lot of wafers is still in the cluster tool;

transferring some of the first new lot and the second new lot of wafers respectively from the designated storage load lock to epitaxial deposition chambers in succession; and sending the first new lot and the second new lot of wafers out of the cluster tool from the transfer load lock together in a batch.

20. The method according to claim 14, wherein each wafer processed by the cluster tool is transferred the designated storage load lock from the transfer load lock prior to processing and is transferred back to the transfer load lock through the designated storage load lock after processing.

* * * * *